United States Patent
Yang et al.

(10) Patent No.: US 7,777,297 B2
(45) Date of Patent: Aug. 17, 2010

(54) NON-PLANAR FUSE STRUCTURE INCLUDING ANGULAR BEND

(75) Inventors: Haining S. Yang, Wappingers Falls, NY (US); Wai-Kin Li, Beacon, NY (US); Deok-Kee Kim, Bedford Hills, NY (US)

(73) Assignee: International Business Machines Corporation, Armonk, NY (US)

( * ) Notice: Subject to any disclaimer, the term of this patent is extended or adjusted under 35 U.S.C. 154(b) by 522 days.

(21) Appl. No.: 11/693,041

(22) Filed: Mar. 29, 2007

(65) Prior Publication Data

US 2008/0237786 A1 Oct. 2, 2008

(51) Int. Cl.
*H01L 29/41* (2006.01)
(52) U.S. Cl. ............... 257/529; 257/E23.149; 257/209
(58) Field of Classification Search .......... 257/209, 257/529, E23.149
See application file for complete search history.

(56) References Cited

U.S. PATENT DOCUMENTS

| 4,064,493 | A | | 12/1977 | Davis |
| 5,420,456 | A | | 5/1995 | Galbi et al. |
| 5,963,825 | A | * | 10/1999 | Lee et al. ............ 438/601 |
| 6,261,873 | B1 | * | 7/2001 | Bouldin et al. ....... 438/132 |
| 6,570,238 | B2 | * | 5/2003 | Hui et al. ............ 257/529 |
| 7,545,253 | B2 | * | 6/2009 | Hsu et al. ............ 337/159 |
| 2002/0074618 | A1 | * | 6/2002 | Marshall et al. ...... 257/529 |
| 2004/0219720 | A1 | * | 11/2004 | Jeng et al. ........... 438/131 |
| 2007/0210411 | A1 | * | 9/2007 | Hovis et al. .......... 257/529 |

* cited by examiner

*Primary Examiner*—Jerome Jackson, Jr.
*Assistant Examiner*—Paul A Budd
(74) *Attorney, Agent, or Firm*—Scully, Scott, Murphy & Presser, P.C.; H. Daniel Schnurmann (57) ABSTRACT

A fuse structure includes a non-planar fuse material layer typically located over and replicating a topographic feature within a substrate. The non-planar fuse material layer includes an angular bend that assists in providing a lower severance current within the non-planar fuse material layer.

16 Claims, 9 Drawing Sheets

NON-PLANAR FUSE STRUCTURE INCLUDING ANGULAR BEND

BACKGROUND

1. Field of the Invention

The invention relates generally to fuses within microelectronic structures. More particularly, the invention relates to enhanced performance fuses within microelectronic structures.

2. Description of the Related Art

In addition to transistors, resistors, capacitors and diodes, semiconductor circuits also often include fuses. Fuses within semiconductor circuits may be used for several purposes. For example and without limitation, fuses may be used within semiconductor circuits for purposes of introducing or deleting customized circuit elements into a semiconductor circuit. In addition, fuses within semiconductor circuits are alternatively used for purposes of severing a non-operative portion of a semiconductor circuit and replacing that non-operative portion with a redundant semiconductor circuit fabricated upon the same semiconductor substrate. Such redundant semiconductor circuit replacement is typically effected within memory semiconductor circuits, since memory semiconductor circuits often comprise multiple semiconductor circuit portions having an identical design.

While fuses are thus desirable within semiconductor circuit design and fabrication, and provide an essential tool for cost effective and efficient semiconductor circuit design and fabrication, fuses are nonetheless not entirely without problems within semiconductor circuit fabrication. In particular, as semiconductor structure and device dimensions have decreased and semiconductor circuit operating voltages have also decreased, it has become increasingly more difficult to fabricate within semiconductor circuits fuses that are susceptible to comparatively low severing (i.e., programming) currents at typical severing (i.e., programming) voltages of less than about 3 volts.

Various fuse structures for use within semiconductor circuits, and methods for fabrication thereof, are known in the semiconductor fabrication art. Included in particular is a fuse structure and method for fabrication thereof disclosed within Galbi et al., in U.S. Pat. No. 5,420,456. This particular fuse structure is fabricated using a planar fuse material layer designed with an in-plane angular bend that provides for a substantial reduction (i.e., about a 90% reduction) in severance current when severing the fuse material layer within the fuse structure.

Semiconductor structure and device dimensions are certain to continue to decrease as semiconductor technology advances. As a result thereof, desirable are semiconductor structures and devices including fuse structures, as well as methods for fabricating the semiconductor structures and devices including the fuse structures, that provide fuses with enhanced performance.

SUMMARY

The invention provides a fuse structure for use within a microelectronic structure (i.e., such as but not limited to a semiconductor structure), as well as a method for fabricating the fuse structure that is used within the microelectronic structure. The fuse structure in accordance with the invention includes a non-planar fuse material layer that has an angular bend. A "non-planar" fuse material layer is intended to be at least substantially non-planar and have a deviation from planarity of at least about 15 degrees, typically with respect to a planar substrate over which is located the fuse material layer. Typically, but not necessarily, the non-planarity of the fuse material layer is provided solely by the angular bend of the fuse material layer. Alternatively, the non-planarity of the fuse material layer may be independent of the angular bend. Under the former circumstances, and in accordance with disclosure below, the angular bend will have a considerably larger bend angle than the above described deviation from planarity. Due to the angular bend within the non-planar fuse material layer, a fuse from which is comprised the fuse material layer may be severed at a lower severance current while using a conventional severance voltage.

A particular fuse structure in accordance with the invention includes a non-planar fuse material layer located over a substrate. The non-planar fuse material layer includes an angular bend.

Another particular fuse structure in accordance with the invention includes a substrate including a topographic feature. This other fuse structure also includes a non-planar fuse material layer located over the substrate including the topographic feature that provides an angular bend within the non-planar fuse material layer.

A method for fabricating a fuse structure in accordance with the invention includes providing a substrate including a topographic feature located within the substrate. This particular method also includes forming over the substrate including the topographic feature a non-planar fuse material layer that replicates the topographic feature to provide an angular bend within the non-planar fuse material layer.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein:

FIG. 1A and FIG. 1B to FIG. 3A and FIG. 3B show a series of schematic plan-view diagrams and schematic cross-sectional diagrams illustrating the results of progressive stages in fabricating a fuse structure in accordance with a particular embodiment of the invention.

FIG. 7A and FIG. 7B to FIG. 9A and FIG. 9B show a series of schematic plan-view diagrams and schematic cross-sectional diagrams illustrating the results of progressive stages in fabricating a fuse structure in accordance with still yet another particular embodiment of the invention.

DESCRIPTION OF THE PREFERRED EMBODIMENT

The invention, which includes a fuse structure and a method for fabricating the fuse structure, is understood within the context of the description that follows. The description that follows is understood within the context of the drawings described above. Since the drawings are intended for illustrative purposes, the drawings are not necessarily drawn to scale.

Figure 1A:
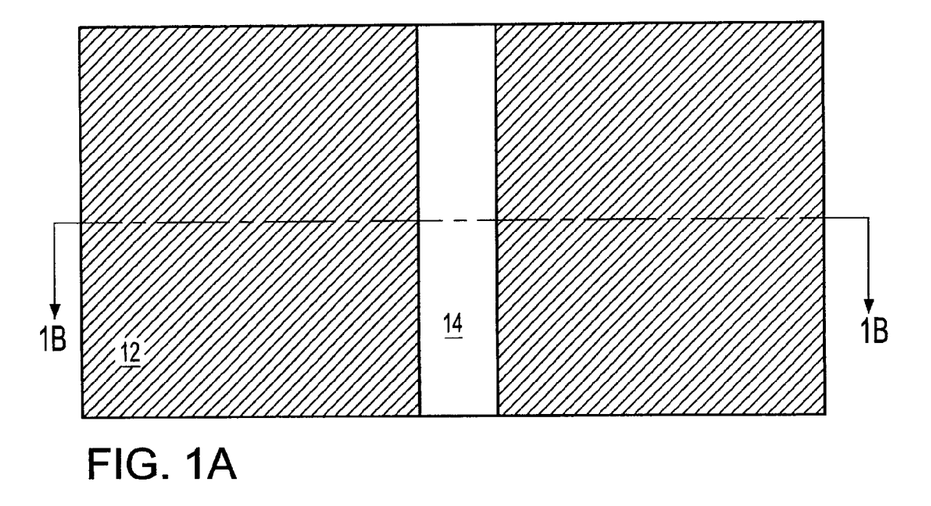
Figure 1B:
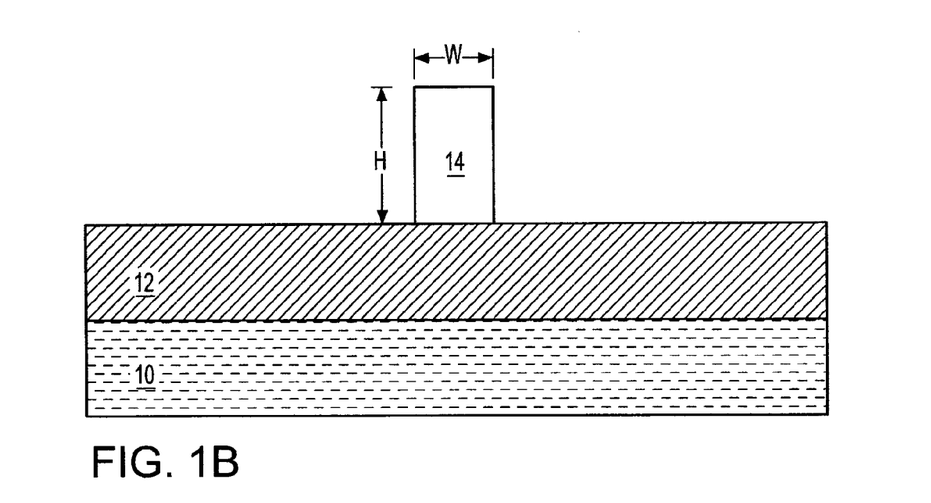

FIG. 1A and FIG. 1B to FIG. 3A and FIG. 3B show a series of schematic plan-view diagrams and schematic cross-sectional diagrams illustrating the results of progressive stages in fabricating a fuse structure in accordance with a particular embodiment of the invention. This particular fuse structure comprises a first embodiment of the invention. FIG. 1A and FIG. 1B show a mated pair including a schematic plan-view diagram and a corresponding schematic cross-sectional diagram of the fuse structure at an early stage in the fabrication thereof in accordance with this particular embodiment.

FIG. 1A (by implication) and FIG. 1B show a substrate 10. A dielectric layer 12 is located upon the substrate 10 and a topographic dielectric feature 14 is located upon the dielectric layer 12.

The substrate 10 may comprise any of several materials that are conventional in the microelectronic fabrication art. Non-limiting examples include conductor materials, semiconductor materials and dielectric materials, as well as laminates thereof and composites thereof. More particularly, the substrate 10 typically comprises a semiconductor material, and in particular a semiconductor substrate that comprises the semiconductor material. Alternatively, the substrate 10 may comprise a ceramic material, and in particular a ceramic substrate that comprises the ceramic material.

Within the context of semiconductor materials, the substrate 10 may comprise any of several semiconductor materials. Non-limiting examples include silicon, germanium, silicon-germanium alloy, silicon-carbon, silicon-germanium-carbon alloy and compound (i.e., III-V and II-VI) semiconductor materials. Non-limiting examples of compound semiconductor materials include gallium arsenide, indium arsenide and indium phosphide semiconductor materials.

Within the context of ceramic materials, the substrate 10 may comprise, but is not limited to aluminum oxides, silicon oxides, vanadium oxides and titanium oxides, as well as laminates thereof and composites thereof.

When the substrate 10 comprises a semiconductor substrate, the semiconductor substrate may further include any of several semiconductor devices. Such semiconductor devices may include, but are not limited to resistors, transistors, diodes and capacitors. The semiconductor devices may be fabricated using methods and materials that are otherwise generally conventional in the semiconductor fabrication art.

Each of the dielectric layer 12 and the topographic dielectric feature 14 may independently comprise any of several dielectric materials. Non-limiting examples of such independent dielectric materials include oxides, nitrides and oxynitrides, particularly of silicon, but oxides, nitrides and oxynitrides of other elements are not excluded. Each of the dielectric layer 12 and the topographic dielectric feature 14 may comprise a crystalline or a non-crystalline dielectric material, with crystalline dielectric materials being highly preferred. Each of the dielectric layer 12 and the topographic dielectric feature 14 may also be formed using any of several methods. Non-limiting examples include thermal or plasma oxidation or nitridation methods, chemical vapor deposition methods and physical vapor deposition methods. Typically, one of the dielectric layer 12 and the topographic dielectric feature 14 comprises an oxide dielectric material while the other of the dielectric layer 12 and the topographic dielectric feature comprises a nitride dielectric material. Typically, the dielectric layer 12 has a thickness from about 400 to about 3000 angstroms. Typically, the topographic dielectric feature 14 has a thickness H (i.e., a step height) from about 200 to about 2500 angstroms and a linewidth W (i.e., a plateau width or step width from about 300 to about 2000 angstroms. Similar topographic features within additional embodiments that follow will have similar dimensions.

Although FIG. 1 illustrates the dielectric layer 12 and the topographic dielectric feature 14 as separate layers, such an independence of the dielectric layer 12 and the topographic dielectric feature 14 is not a limitation of the invention. Rather, the topographic dielectric feature 14 may be an integral part of the dielectric layer 12, and for example may be formed using a selective masked etching of a single dielectric layer of thickness greater than the dielectric layer 12.

Figure 2A:
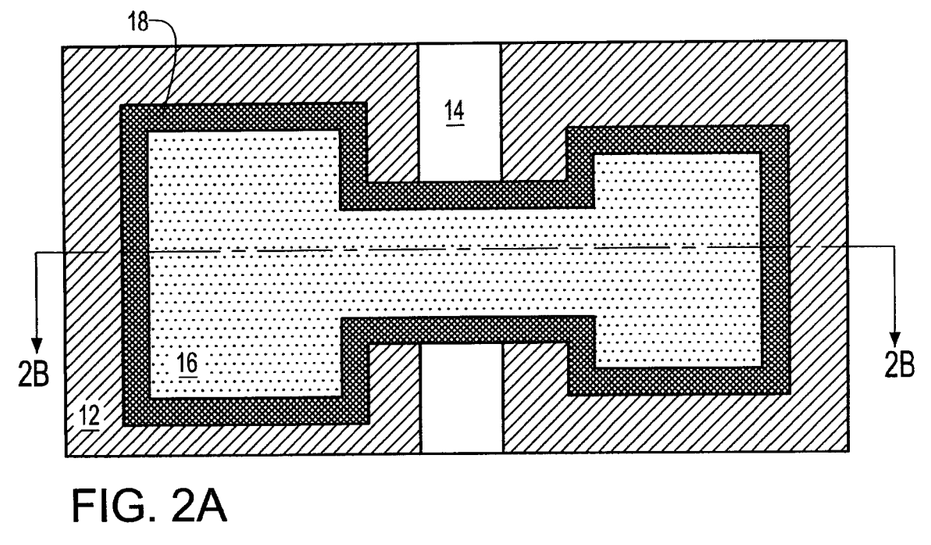
Figure 2B:
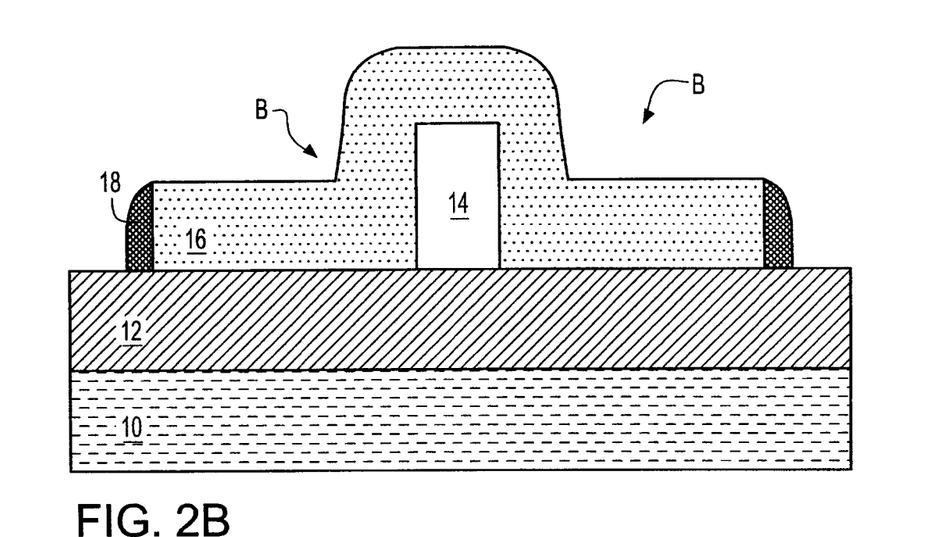

FIG. 2A and FIG. 2B show a schematic plan-view diagram and a schematic cross-sectional diagram that illustrate a silicon material layer 16 located conformally upon the dielectric layer 12 and the topographic dielectric feature 14. The silicon material layer 16 replicates a topography of the topographic dielectric feature 14 to thus provide a plurality of angular bends B within the silicon material layer 16. Within the instant embodiment, the silicon material layer 16 may comprise any of several silicon materials. Most typical are amorphous silicon materials and polycrystalline silicon materials. The silicon materials may be conformally deposited using any of several methods. Non-limiting examples include chemical vapor deposition methods and physical vapor deposition methods. The silicon material layer 16 may also be formed doped or undoped. Under circumstances where the silicon material layer 16 is formed doped, the silicon material layer 16 will typically comprise a generally reduced level of a dopant concentration, typically from about 1E18 to about 1E22 dopant atoms per cubic centimeter within the silicon material layer 16. Typically, the silicon material layer 16 comprises an amorphous silicon material or a polysilicon material that has a thickness from about 400 to about 1500 angstroms.

The spacer 18 typically comprises a dielectric spacer material, although neither the embodiment nor the invention is necessarily so limited. Alternatively, conductor spacer materials and semiconductor spacer materials may also be used. The dielectric spacer material may be selected from the same group of dielectric materials that are used for forming the dielectric layer 12 and the topographic dielectric feature 14, but generally, the dielectric spacer material and the dielectric material from which is formed the dielectric layer 12 (but not necessarily the topographic dielectric feature 14) will comprise different dielectric materials so that the spacer 18 may be formed absent any over-etching into the dielectric layer 12. The spacer 18 is formed using a generally conventional blanket layer deposition and anisotropic etchback method that provides the spacer 18 with the characteristic inward pointed tapered shape. Typically, the spacer 18 comprises a silicon nitride material when the dielectric layer 12 comprises a silicon oxide material.

Figure 3A:
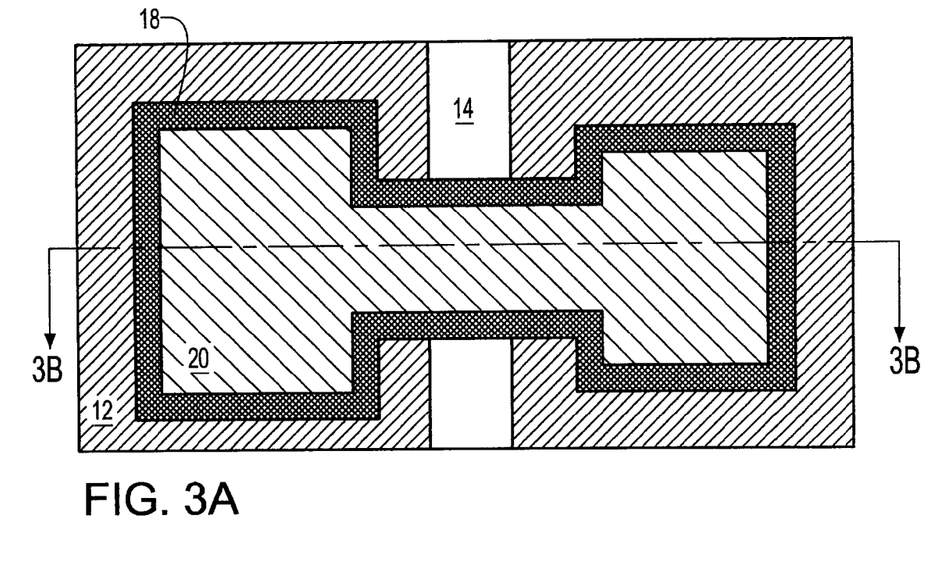
Figure 3B:
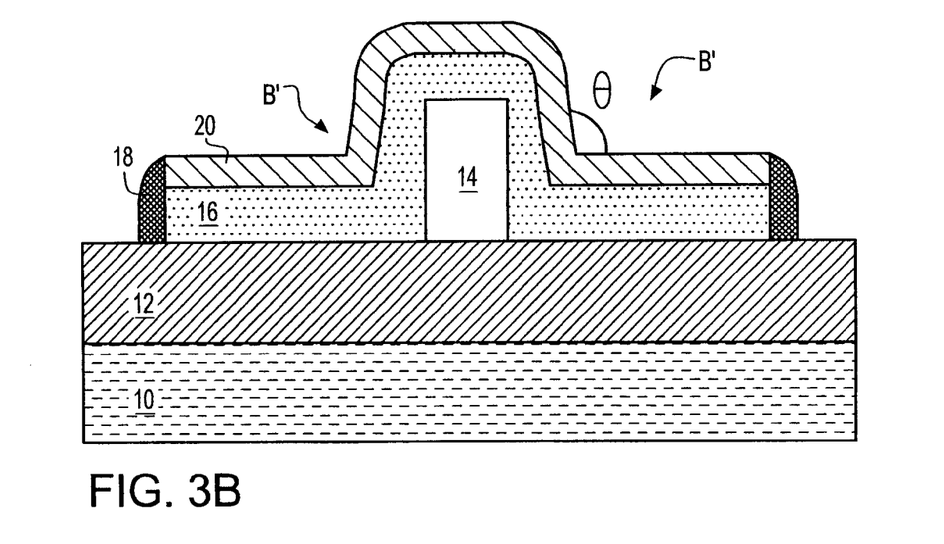

FIG. 3A and FIG. 3B show a schematic plan-view diagram and a schematic cross-sectional diagram that illustrate a silicide layer 20 located upon the fuse structure of FIG. 2A and FIG. 2B, and in particular upon the silicon material layer 16 within the fuse structure of FIG. 2A and FIG. 2B. The silicide layer 20 may comprise any of several silicide materials derived from any of several corresponding silicide forming metals. Non-limiting examples of candidate silicide forming metals include nickel, cobalt, titanium, tungsten, erbium, ytterbium, platinum and vanadium silicide forming metals. Nickel and cobalt silicide forming metals are particularly common. Typically, the silicide layer 20 is formed using a salicide method. The salicide method includes: (1) forming a blanket silicide forming metal layer upon the fuse structure of FIG. 2A and FIG. 2B; (2) thermally annealing the blanket silicide forming metal layer with the silicon material layer 16 to selectively form the silicide layer 20 while leaving unreacted metal silicide forming metal layers on, for example, the spacer 18 and the dielectric layer 12; and (3) selectively stripping unreacted portions of the silicide forming metal layer from, for example, the spacer 18 and the dielectric layer 12. Typically, the silicide layer 20 comprises a nickel silicide material or a cobalt silicide material that has a thickness from about 50 to about 400 angstroms.

Within the instant embodiment, the silicide layer 20 is intended as a fuse material layer and the silicide material from which is comprised the silicide layer 20 is intended as a fuse material. As is illustrated within the schematic plan-view and schematic cross-sectional diagrams of FIG. 3A and FIG. 3B, the silicide layer 20 replicates the plurality of angular bends B within the silicon material layer 16 that is illustrated in FIG. 2A and FIG. 2B to form a corresponding plurality of angular bends B'. The angular bends B' typically include a bend angle Θ from about 45 to about 135 degrees, more particularly from about 70 to about 120 degrees and most preferably from about 80 to about 110 degrees.

FIG. 3A and FIG. 3B show a schematic plan-view diagram and a schematic cross-sectional diagram of a fuse structure in accordance with a particular embodiment of the invention that comprises a first embodiment of the invention. The fuse structure includes: (1) a topographic dielectric feature 14 located upon a dielectric layer 12 in turn located over a substrate 10; (2) a silicon material layer 16 located upon and replicating the topographic dielectric feature 14 to provide a least one angular bend B within the silicon material layer 16; and (3) a silicide layer 20 located upon the silicon material layer 16 to further replicate the at least one angular bend B and provide therefrom at least one angular bend B'. As will be illustrated within the context of further disclosure below, the at least one angular bend B' provides for enhanced severance properties when severing a fuse within a fuse structure in accordance with the instant embodiment, and further in accordance with the invention.

Figure 4A:
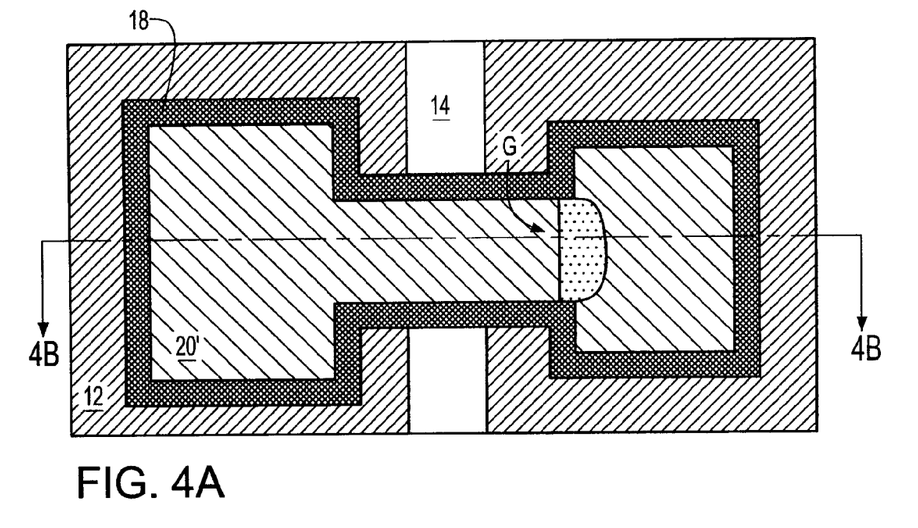
FIG. 4A and FIG. 4B show the results of severing the fuse structure whose schematic plan-view diagram and schematic cross-sectional diagram are illustrated in FIG. 3A and FIG. 3B.
Figure 4B:
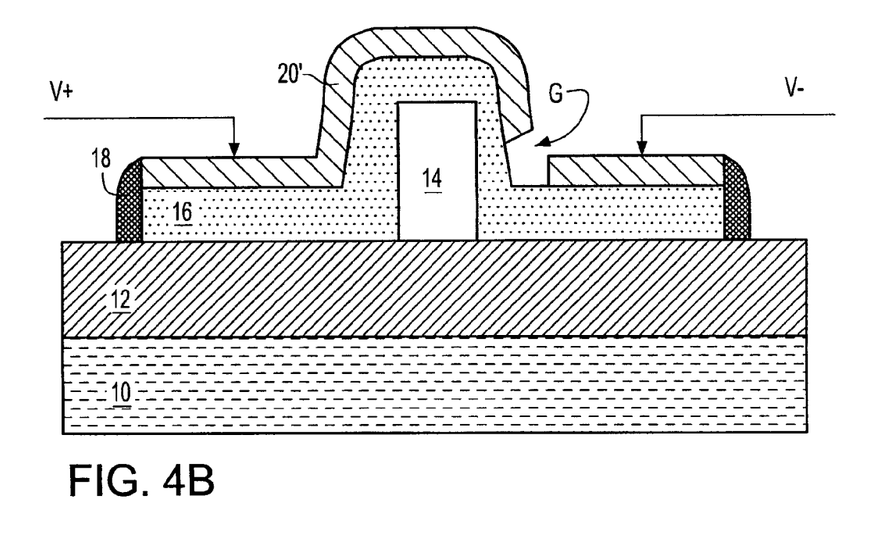

FIG. 4A and FIG. 4B show a schematic plan-view diagram and a schematic cross-sectional diagram illustrating the results of severing the fuse structure that is illustrated in FIG. 3A and FIG. 3B. As is illustrated in FIG. 4A and FIG. 4B, a voltage V+ and V− having a sufficient severance current is applied to opposite ends of the silicide layer 20 to sever the silicide layer 20 and thus form a silicide layer 20' having a gap G therein. Typically, the severance voltage is from about 0.5 to about 4 volts and the severance current is from about 0.1 to about 15 milliamps. The silicide layer 20 is severed in particular at the location of at least one of the angular bends B', and generally at an angular bend B' that provides a most substantial thinning of the silicide layer 20.

While not wishing to be bound by any particular theory of operation of the instant embodiment or the invention, it is reasonably understood (within the context of the above cited related art) that the angular bends B' within the silicide layer 20 that is illustrated in FIG. 3A and FIG. 3B provide an inner lying portion of a bend B' within the silicide layer 20 that experiences a higher current density when a severance voltage and a severance current are applied to the silicide layer 20. Such an enhanced current density at an inner lying portion of an angular bend B' within the silicide layer 20 may lead to enhanced electromigration within the silicide material from which is comprised the silicide layer 20. Such enhanced electromigration may in turn lead to effective severance of the silicide layer 20 at a lower severance current (assuming a constant severance voltage) in comparison with a silicide layer that is of the same projected dimensions as the silicide layer 20 that is illustrated in FIG. 3A and FIG. 3B, but is otherwise planar. The use of a lower severance current is desirable within the context of a fuse in general, since as a natural progression typical supply currents and voltages of semiconductor circuits are also being progressively reduced.

Figure 5A:
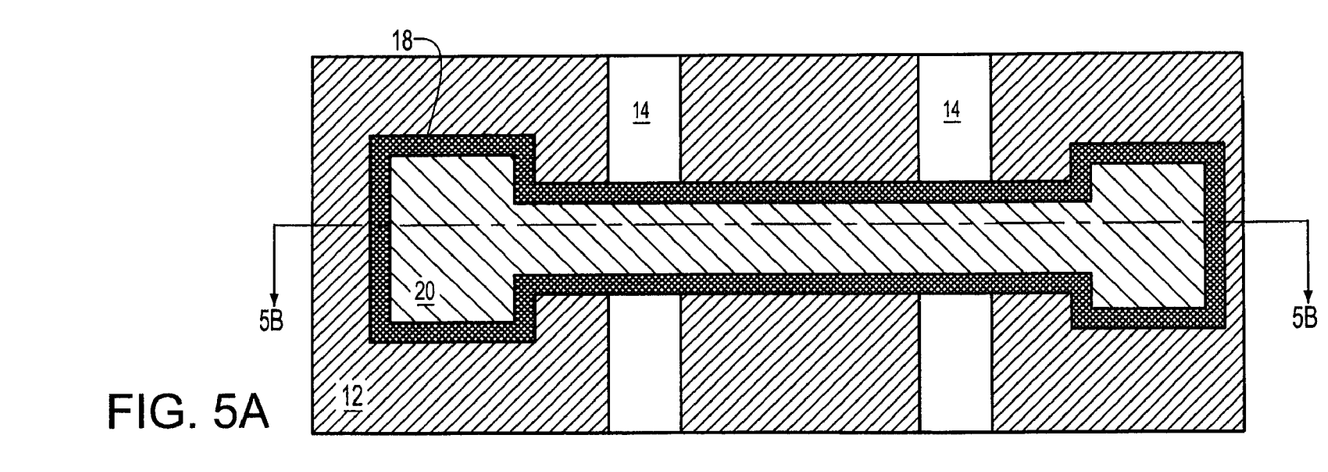
FIG. 5A and FIG. 5B show a schematic plan-view diagram and a schematic cross-sectional diagram illustrating a fuse structure in accordance with another particular embodiment of the invention.
Figure 5B:
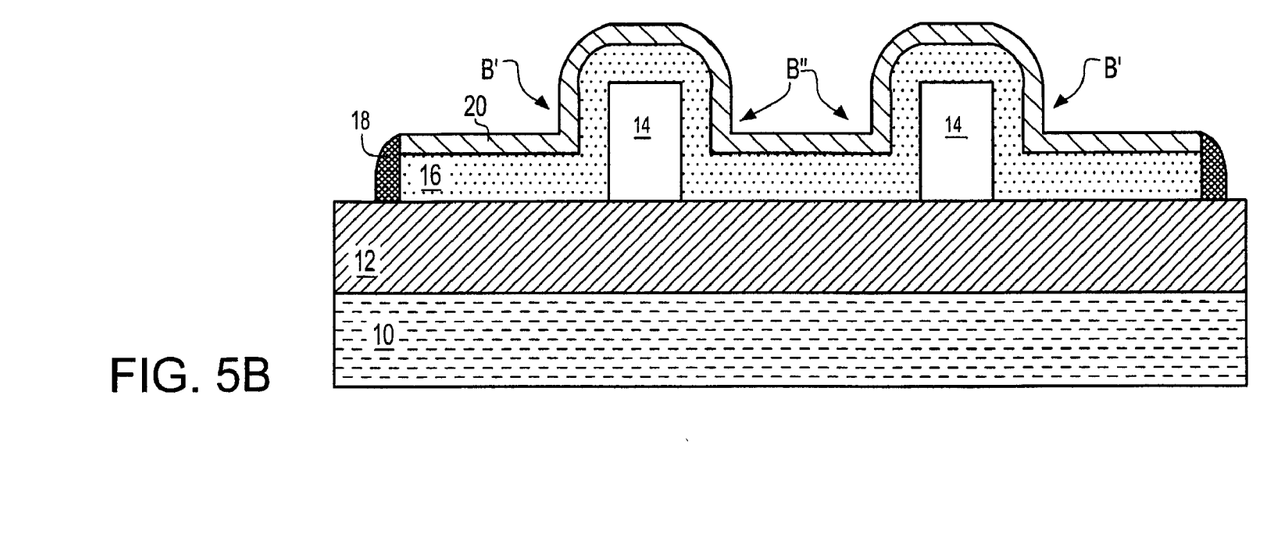

FIG. 5A and FIG. 5B show a schematic plan-view diagram and a schematic cross-sectional diagram of a fuse structure in accordance with another particular embodiment of the invention. This other particular embodiment of the invention comprises a second embodiment of the invention.

The fuse structure whose schematic plan-view and schematic cross-sectional diagrams are illustrated in FIG. 5A and FIG. 5B differs in substance from the fuse structure whose schematic plan-view and schematic cross-sectional diagrams are illustrated in FIG. 4A and FIG. 4B by the presence of two topographic dielectric features 14 located upon the dielectric layer 12 rather than one topographic dielectric feature 14 located upon the dielectric layer 12. The use of two topographic dielectric features 14 in turn provides for four angular bends within the silicide layer 20 rather than two angular bends within the silicide layer 20. The two of the four angular bends that are located on the outward sides of the topographic dielectric features 14 are designated as angular bends B', similarly with the angular bends B' illustrated within FIG. 3B within the first embodiment. The remaining two angular bends interposed between the two topographic dielectric features 14 are designated as angular bends B".

As a result of having a greater number of angular bends B' and B" within the silicide layer 20, this second embodiment in general provides an enhanced statistical opportunity for realizing a statistically low severance current. Moreover, and also notable within this second embodiment, the angular bends B" interposed between the two topographic dielectric features 14 may in general be expected to provide for a comparatively reduced severance current when severing the silicide layer 20 at the angular bends B", since the silicide layer 20 thickness at the angular bends B" may tend to be thinner than the silicide layer 20 thickness at the angular bends B'. Such a difference of silicide layer 20 thickness at the angular bends B" in comparison with the angular bends B" may in turn derive from a greater shadowing by the topographic dielectric features 14 of the locations of the angular bends B" in comparison with the locations of the angular bends B' when initially depositing the silicide forming metal from which is comprised the silicide layer 20.

Figure 6A:
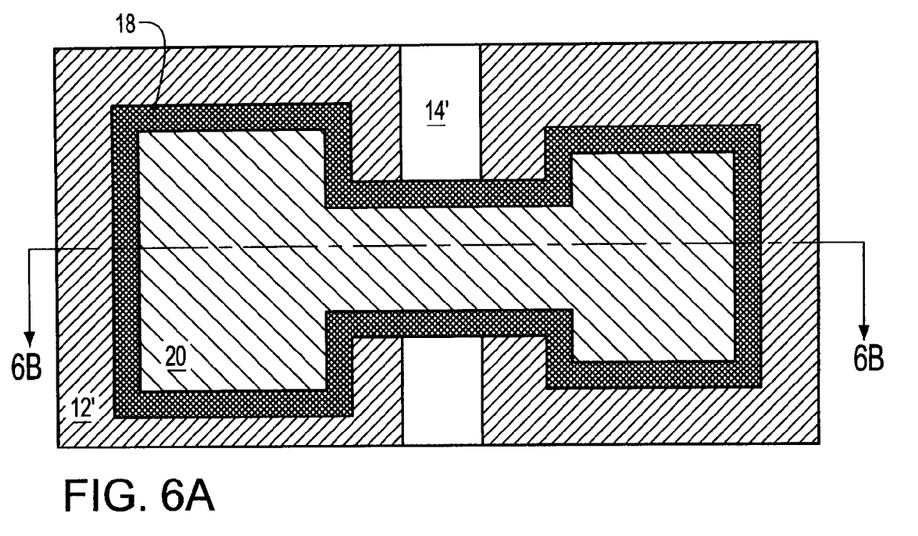
FIG. 6A and FIG. 6B show a schematic plan-view diagram and a schematic cross-sectional diagram illustrating a fuse structure in accordance with yet another particular embodiment of the invention.
Figure 6B:
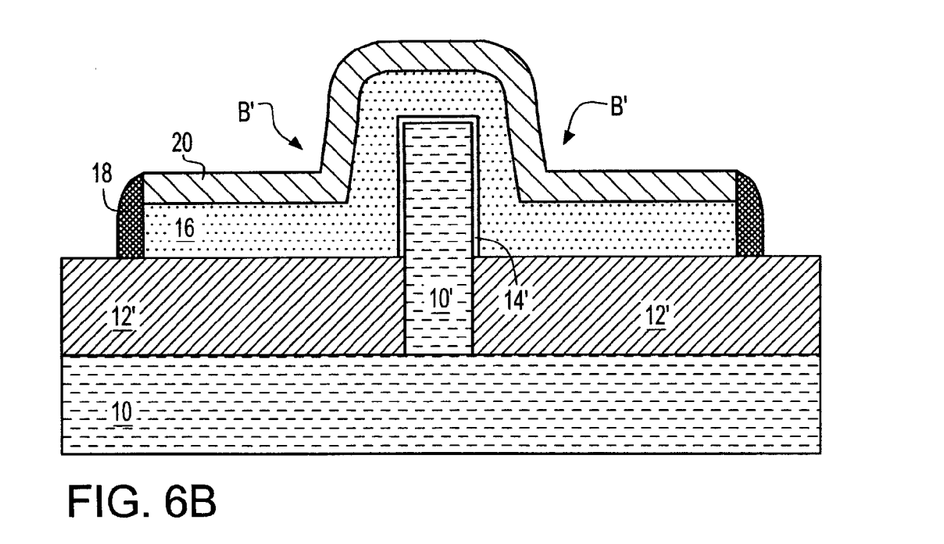

FIG. 6A and FIG. 6B show a schematic plan-view diagram and a schematic cross-sectional diagram of a fuse structure in accordance with yet another particular embodiment of the invention. This yet another particular embodiment comprises a third embodiment of the invention.

The fuse structure whose schematic plan-view and schematic cross-sectional diagrams are illustrated in FIG. 6A and FIG. 6B similarly also relates to the fuse structure whose schematic plan-view and schematic cross-sectional view diagrams are illustrated in FIG. 3A and FIG. 3B, but this fuse structure differs by the absence of a topographic dielectric feature 14. Rather, as is illustrated within the schematic plan-view and schematic cross-sectional diagrams of FIG. 6A and FIG. 6B, there is instead the presence of a semiconductor fin 10' that penetrates a dielectric layer 12' that is located upon the substrate 10. In turn, a dielectric capping layer 14' is located upon the semiconductor fin 10'.

In general, the schematic plan-view and schematic cross-sectional diagrams of FIG. 6B and FIG. 6B are intended to illustrate applicability of the inventive concept within the context of a fin-FET device structure. A fin-FET device structure typically includes a semiconductor fin (such as the semiconductor fin 10'), that is located upon and may be contiguous with a semiconductor substrate (i.e., such as the substrate 10 when the substrate 10 comprises a semiconductor material). The semiconductor fin (such as the semiconductor fin 10') provides a channel region within the fin-FET device, and as a result thererof a fin-FET device array may be fabricated with a higher aerial density than a normal planar FET device array. As is understood by a person skilled in the art, a gate electrode within a fin-FET device (i.e., which correlates with the silicon material layer 16 within FIG. 6A and FIG. 6B) typically comprises a polysilicon material that typically has a silicide layer (i.e., such as the silicide layer 20) located thereupon. The gate electrode is typically separated from a semiconductor fin channel region by a gate dielectric that may be analogous to the dielectric capping layer 14' that is illustrated within FIG. 6A and FIG. 6B. Thus, the basic fuse structure that is illustrated in FIG. 6A and FIG. 6B may readily derive from a fin-FET structure.

Within FIG. 6A and FIG. 6B, the semiconductor fin 10' may typically have dimensions analogous or identical to the dimensions of the topographic dielectric layer 14 that is illustrated within the first embodiment and the second embodiment. In addition, the semiconductor fin 10' may comprise semiconductor materials that are analogous, equivalent or identical to the semiconductor materials from which may be comprised the substrate 10, when in turn the substrate 10 comprises a semiconductor material. Finally, the dielectric capping layer 14' may comprise a generally conventional gate dielectric material such as but not limited to a silicon oxide, a silicon nitride or a silicon oxynitride dielectric material (i.e., having a dielectric constant from about 4 to about 20), or alternatively a generally higher dielectric constant gate dielectric material (i.e., having a dielectric constant greater than about 20).

Figure 7A:
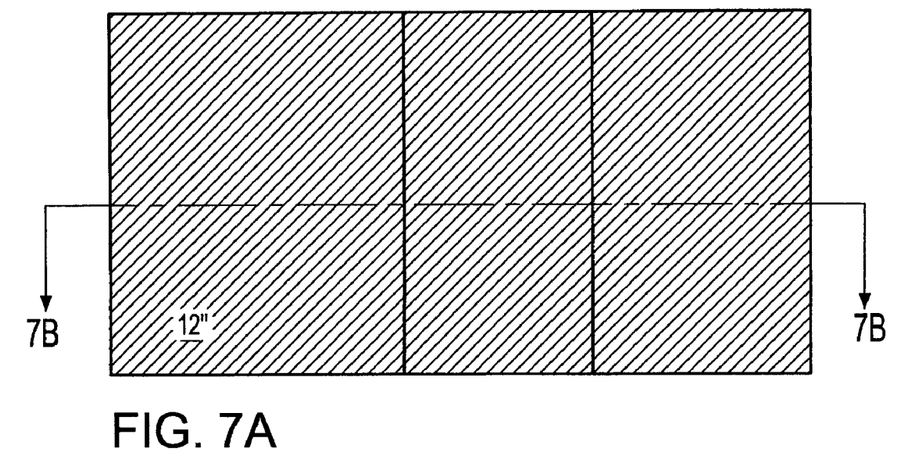
Figure 7B:
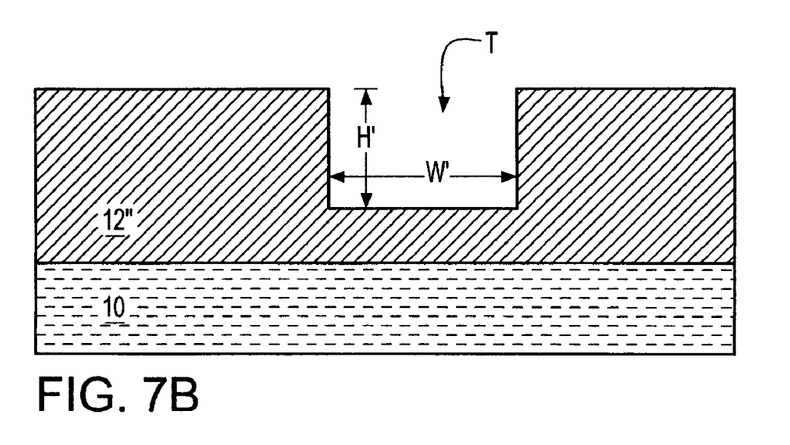

FIG. 7A and FIG. 7B to FIG. 9A and FIG. 9B show a series of schematic plan-view and schematic cross-sectional diagrams illustrating the results of progressive stages in fabricating a fuse structure in accordance with yet another embodiment of the invention. This yet another embodiment of the invention comprises a fourth embodiment of the invention. FIG. 7A and FIG. 7B show a mated schematic plan-view diagram and schematic cross-sectional diagram of the fuse structure in accordance with the fourth embodiment of the invention.

The fuse structure whose schematic plan-view and schematic cross-sectional diagrams are illustrated in FIG. 7A and FIG. 7B differs primarily from the fuse structure whose schematic plan-view and schematic cross-sectional diagrams are illustrated in FIG. 1A and FIG. 1B with respect to absence of the dielectric layer 12 and the topographic dielectric feature 14 as separate structural elements. Rather, substituted within FIG. 7A and FIG. 7B for both of the dielectric layer 12 and the topographic dielectric feature 14 is a topographic dielectric layer 12" that includes therein a trench T that is intended as having dimensions (i.e., a step height H' and a plateau width W') that generally correspond with the thickness H and the linewidth W of the topographic dielectric feature 14 that is illustrated in FIG. 1A and FIG. 1B.

Figure 8A:
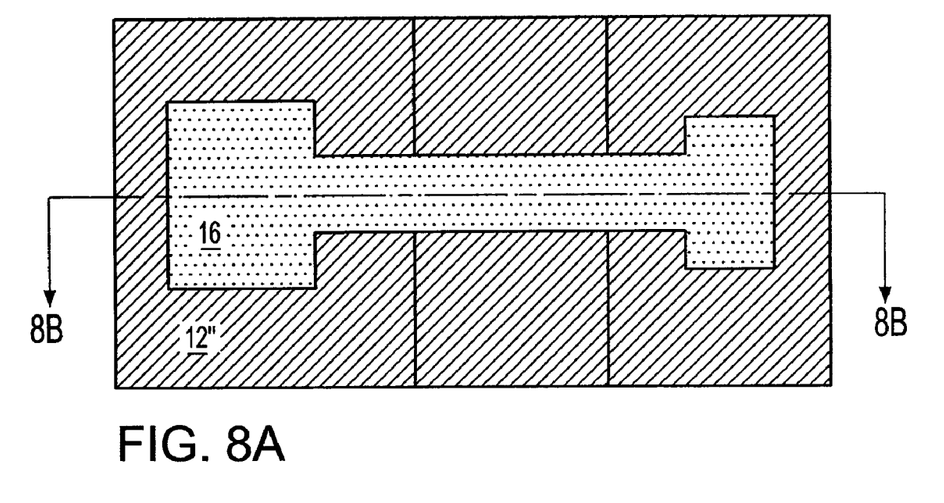
Figure 8B:
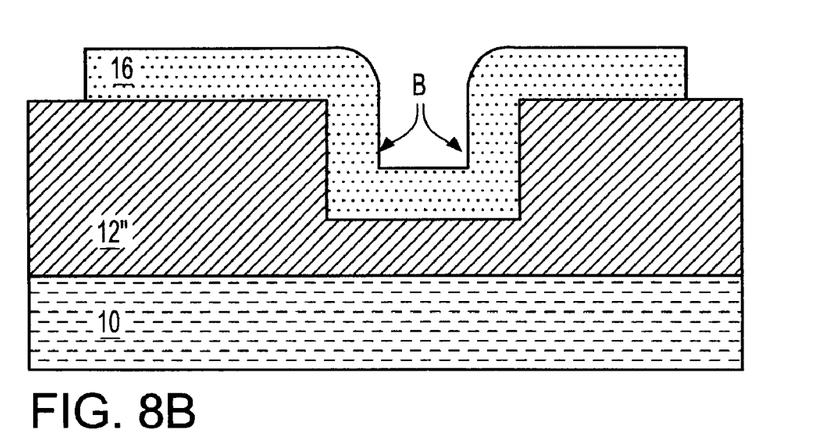

FIG. 8A and FIG. 8B show a schematic plan-view diagram and a schematic cross-sectional diagram illustrating a silicon material layer 16 that is located and formed into the trench T within the dielectric layer 12" rather than being located and formed upon the dielectric layer 12 and the topographic dielectric feature 14 that is illustrated in FIG. 2A and FIG. 2B. Analogously with the fuse structure of FIG. 2A and FIG. 2B, the silicon material layer 16 defines a pair of angular bends B.

Figure 9A:
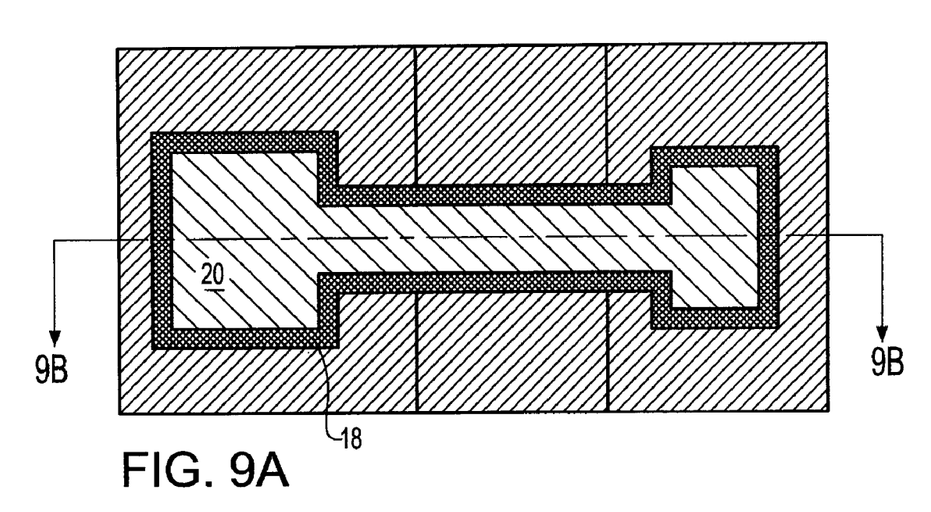
Figure 9B:
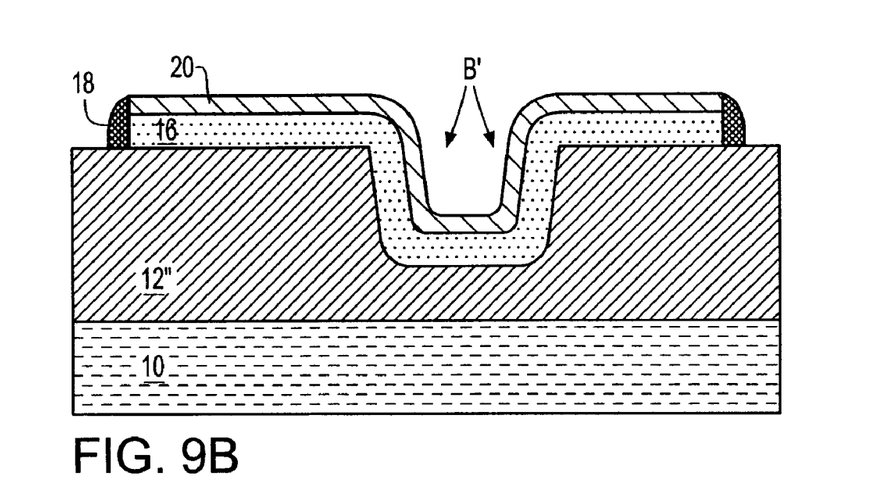

FIG. 9A and FIG. 9B show a schematic plan-view diagram and a schematic cross-sectional diagram that illustrate a silicide layer 20 located upon the silicon material layer 16. FIG. 8A and FIG. 8B also illustrate a spacer 18 located surrounding the silicon material layer 16 and the silicide layer 20. The spacer 18 is otherwise analogous or equivalent to the spacer 18 that is illustrated in FIG. 2A and FIG. 2B. The silicide layer 20 is also otherwise analogous or equivalent to the silicide layer 20 that is illustrated in FIG. 3A and FIG. 3B. As is illustrated within FIG. 9A and FIG. 9B, the silicide layer replicates the angular bends B within the silicon material layer 16 that is illustrated within FIG. 8A and FIG. 8B to form a plurality of angular bends B'.

FIG. 9A and FIG. 9B illustrate a fuse structure topographically different but nonetheless functionally equivalent to the fuse structure whose schematic plan-view and cross-sectional diagrams are illustrated in FIG. 3A and FIG. 3B. The topographic difference between the fuse structures of FIG. 9A and FIG. 9B in comparison with the fuse structures of FIG. 3A and FIG. 3B derive from the use of a trench T within a dielectric layer 12" as a topographic feature rather than a topographic dielectric feature 14 located upon a dielectric layer 12 and used as a topographic feature.

Each of the preferred embodiments use a silicide layer 20 a fuse material layer. The fuse material layer is located over and conformally replicates a topographic feature within or upon a dielectric layer over which the silicide layer 20 is located and formed. As a result thereof, the silicide layer 20 (which is non-planar) includes at least one angular bend B' or B" that allows for a current density increase at a portion of the angular bend B' or B", to further allow for severance of a fuse from which is comprised the fuse material layer while using a lower severance current at a conventional or a generally reduced severance voltage.

While the preferred embodiments illustrate the invention within the context of a silicide layer 20 as a fuse material layer, the invention is not necessarily so limited. Rather, the invention also contemplates use of other than a silicide layer as a fuse material layer. Also contemplated for use when forming fuse material layers within the context of the embodiment and the invention are certain metal nitrides, as well as certain metals, either of which may have appropriate electrical properties or appropriate electromigration properties to provide for use as a fuse material layer. As a particular example, aluminum metal may be used as a fuse material within a fuse material layer within the context of the embodiments and the invention. When comprised of other than a silicide material, a fuse material layer in accordance with additional embodiments of the invention need not necessarily be located upon (and is likely not located upon) a silicon layer such as the silicon layer 16. Rather, such a fuse material layer is likely to be located directly upon a dielectric material layer that includes a topographic feature.

The preferred embodiments of the invention are illustrative of the invention rather than limiting of the invention. Revisions and modifications may be made to methods, materials, structures and dimensions of a fuse structure in accordance with the preferred embodiments, while still providing a fuse structure in accordance with the invention, further in accordance with the accompanying claims.

What is claimed is:

1. A fuse structure comprising:
 a dielectric layer located on a surface of a substrate, said dielectric layer having at least one topographic feature located thereupon;

a silicon material layer located on an upper surface of the dielectric layer and around said at least one topographic feature;

a fuse material layer located over said silicon material layer, the fuse material layer having a non-planar upper surface and including an angular bend; and at least one spacer located on a sidewall edge of said silicon material layer and a sidewall edge of said fuse material layer.

2. The fuse structure of claim 1 wherein the fuse material layer comprises a silicide material, a metal nitride or a metal.

3. The fuse structure of claim 1 wherein the silicon material layer is a polycrystalline silicon material.

4. The fuse structure of claim 1 wherein the angular bend is from about 45 to about 135 degrees.

5. The fuse structure of claim 1 wherein said at least one topographic feature is a separate dielectric layer from said dielectric layer.

6. The fuse structure of claim 1 wherein said at least one topographic feature has said angular bend.

7. A fuse structure comprising:

a semiconductor substrate including a topographic feature, said topographic feature is a semiconductor fin that extends upward from a surface of said semiconductor substrate;

a dielectric layer located on said surface of said semiconductor substrate and adjoining a lower portion of said semiconductor fin;

a fuse material layer having a non-planar upper surface and an angular bend located above the dielectric layer and around an upper portion of the semiconductor fin; and at least one spacer located on at least a sidewall edge of said fuse material layer.

8. The fuse structure of claim 7 further comprising a dielectric capping layer located on sidewalls and a top surface of said upper portion of the semiconductor fin.

9. The fuse structure of claim 7 wherein the semiconductor fin has a step height from about 200 to about 2500 angstroms and a step width from about 300 to about 3000 angstroms.

10. The fuse structure of claim 7 wherein the fuse material layer comprises a metal material.

11. The fuse structure of claim 7 wherein the fuse material layer comprises a silicide material.

12. The fuse structure of claim 11 further comprising a silicon material layer located interposed between the dielectric layer and the fuse material layer.

13. The fuse structure of claim 7 further comprising a silicon material layer located interposed between the dielectric layer and the fuse material layer.

14. The fuse structure of claim 7 wherein said semiconductor fin has said angular bend.

15. A fuse structure comprising:

a dielectric layer having at least one trench located on a surface of a substrate, said at least one trench having a bottom wall that is not in contact with said surface of said substrate;

a silicon material layer located within at least said at least one trench;

a fuse material layer having a non-planar upper surface and an angular bend located on said silicon material layer; and at least one spacer located on a sidewall edge of said silicon material layer and a sidewall edge of said fuse material layer.

16. The fuse structure of claim 15 wherein said fuse material layer is a silicide layer, a metal nitride or a metal.

* * * * *